(12) United States Patent
Rosenblatt et al.

(10) Patent No.: US 7,957,153 B2
(45) Date of Patent: Jun. 7, 2011

(54) ELECTRICAL CONNECTION INTERFACES AND METHODS FOR ADJACENTLY POSITIONED CIRCUIT COMPONENTS

(75) Inventors: Michael Rosenblatt, Campbell, CA (US); Amir Salehi, San Jose, CA (US)

(73) Assignee: Apple Inc., Cupertino, CA (US)

( * ) Notice: Subject to any disclaimer, the term of this patent is extended or adjusted under 35 U.S.C. 154(b) by 738 days.

(21) Appl. No.: 12/006,618

(22) Filed: Jan. 3, 2008

(65) Prior Publication Data

US 2009/0175008 A1  Jul. 9, 2009

(51) Int. Cl.
*H05K 7/02* (2006.01)
*H05K 7/06* (2006.01)
*H05K 7/08* (2006.01)
*H05K 7/10* (2006.01)

(52) U.S. Cl. ......... 361/760; 361/782; 361/790; 361/803

(58) Field of Classification Search .......... 361/782–784, 361/790, 803
See application file for complete search history.

(56) References Cited

U.S. PATENT DOCUMENTS

| | | | | |
|---|---|---|---|---|
| 5,426,566 | A | * | 6/1995 | Beilstein et al. ............... 361/735 |
| 6,075,287 | A | * | 6/2000 | Ingraham et al. ............. 257/706 |
| 6,721,187 | B2 | * | 4/2004 | Hall et al. ..................... 361/760 |

* cited by examiner

*Primary Examiner* — Tuan T Dinh
(74) *Attorney, Agent, or Firm* — Ropes & Gray LLP; Jeffrey H. Ingerman

(57) ABSTRACT

Electrical components, such as packaged integrated circuit devices that are mountable on a substrate surface, are provided with at least one exposed electrical contact on a side surface of the component that will be substantially perpendicular to the substrate surface when the component is mounted. Two such components can be mounted side-by-side on the substrate surface with the above-mentioned contacts close to one another between the above-mentioned side surfaces. An electrical connection between the contacts can be made (or perfected) by depositing an electrically conductive connector material in contact with both of the contacts between the above-mentioned side surfaces.

23 Claims, 12 Drawing Sheets

ELECTRICAL CONNECTION INTERFACES AND METHODS FOR ADJACENTLY POSITIONED CIRCUIT COMPONENTS

BACKGROUND OF THE INVENTION

This invention relates to electronic circuitry, and more particularly to making electrical connections between adjacent electronic components in an assembly of such components.

Many electronic systems require multiple electronic components, such as packaged integrated circuit devices, to be placed close together for such purposes as overall system compactness, electrical interconnections of the shortest possible length for increased signaling speed and reduced signal attenuation, etc. It is known to place such components on a printed circuit board ("PCB"), whereby input and/or output ("IO") pins of the components can be interconnected via printed circuit traces on the PCB. Package-on-package ("POP") assembly of such components is also known in which, for example, a packaged integrated circuit with IO or exposed electrical contacts on its lower surface is mounted on top of another such component having IO pins or exposed electrical contacts on its upper surface. The lower surface contacts on the first-mentioned component and the upper surface contacts on the second-mentioned component are vertically aligned with one another and electrically connect to one another, either directly or via some conductive medium such as solder, anisotropic conductive film ("ACF"), or the like.

Further improvements to techniques for interconnecting electronic components in systems are needed for reasons such as the following. Component size is becoming smaller, but the number of required interconnections is becoming larger. This places constraints on how many IO contacts a component can have if contacts are confined to the traditional locations (e.g., the bottom of a component for mounting on a PCB, and/or the top and bottom of a component that will be mounted on a PCB with another component mounted on top via POP). More ways to get signals into and/or out of a component and to and/or from adjacent components are therefore needed.

SUMMARY OF THE INVENTION

In accordance with certain aspects of the invention, a first electronic circuit component (such as a packaged integrated circuit) is provided with at least one exposed electrical contact along a side surface of the component. A second component is similarly provided with an exposed electrical contact along a side surface of the second component. The first and second components are mountable on a substrate such as a PCB so that their sides having the exposed electrical contacts are closely adjacent to and facing one another, and so that the exposed electrical contacts on those sides are also closely adjacent to one another. An electrically conductive material such as solder, an electrically conductive epoxy, or the like is then deposited between the above-mentioned surfaces and in contact with the contacts to electrically connect them.

Further features of the invention, its nature and various advantages, will be more apparent from the accompanying drawings and the following detailed description.

BRIEF DESCRIPTION OF THE DRAWINGS

FIG. 5 shows in accordance with the invention.

DETAILED DESCRIPTION

Figure 1:
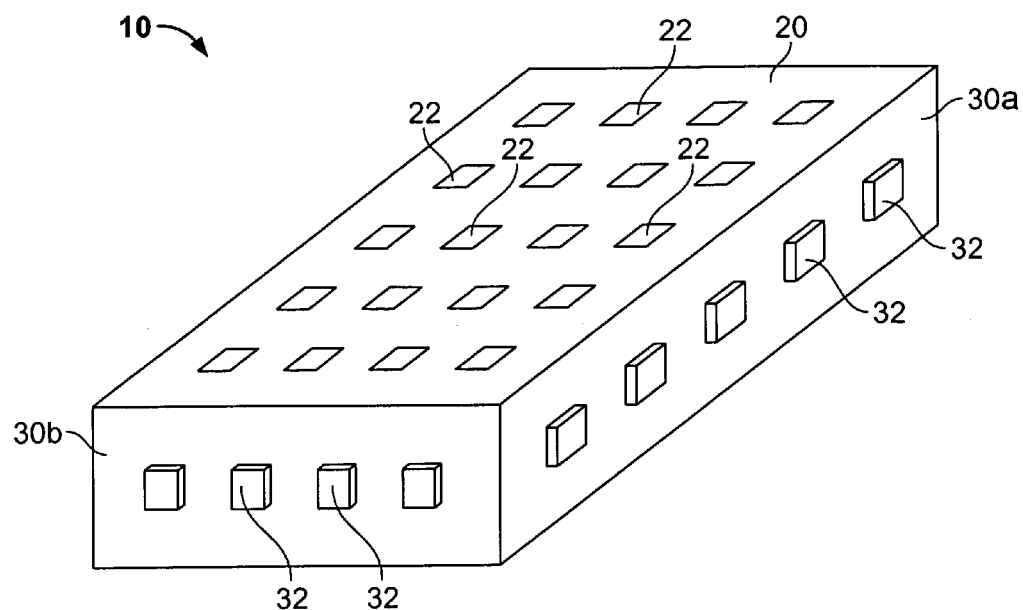
FIG. 1 is a simplified perspective or isometric view of an illustrative electronic circuit component in accordance with the invention.

An illustrative circuit component 10 in accordance with the invention is shown in FIG. 1. Circuit component 10 may be a packaged integrated circuit chip or device. Only the external surface of component 10 is visible in FIG. 1, and indeed FIG. 1 shows component 10 upside down. Component 10 is basically a right parallelepiped, i.e., a six-sided solid object, each side of which is a rectangle (the word rectangle also including square as a possibility). Thus component 10 has a rectangular bottom surface 20, a rectangular side surface 30a, another rectangular side surface 30b, two more rectangular side surfaces that are not visible in FIG. 1, and a rectangular top surface that is also not visible in FIG. 1.

Most of the external surface of component 10 is made of a non-electricity-conducting material (which may also be referred to as an electrical insulator or just an insulator). Inside this external package material, component 10 typically has an integrated circuit device that is not visible in FIG. 1. However, electrical circuits on this internal circuitry are electrically connected to electrical contacts such as 22 and 32 that are exposed on the outside of component 10. Contacts 22 and 32 constitute the means by which electrical signals can be applied to and/or output from the circuitry that is inside the external package 20/30 of component 10. Although contacts 22 and 32 are all shown as simple squares on the various surfaces 20 and 30 of the component package, it will be understood that these contacts can be of various forms and shapes. For example, they can be flush with the associated surface 20 or 30; or they can be raised above that surface; or they can be recessed below that surface; they can be in the form of outwardly projecting pins (perpendicular to the associated surface); and/or they can have various shapes such as square, rectangular, circular, hexagonal, octagonal, oval, or any other desired shape.

Figure 2:
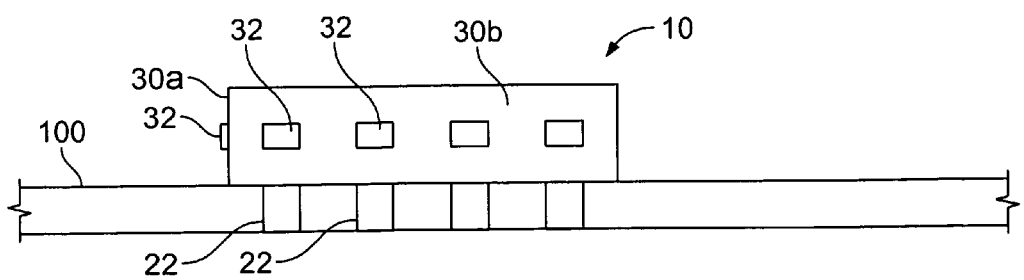
FIG. 2 is a simplified elevational view of a component like that shown in FIG. 1 mounted on the surface of a substrate.

Contacts 22 are conventionally located on the bottom surface of component 10 for conventional connection, e.g., to various circuit traces on a printed circuit board ("PCB"). Such connections may be made, for example, by or with the aid of solder between contacts 22 and the PCB traces. FIG. 2 shows such conventional surface mount assembly ("SMA") of component 10 on PCB 100.

Figure 3:
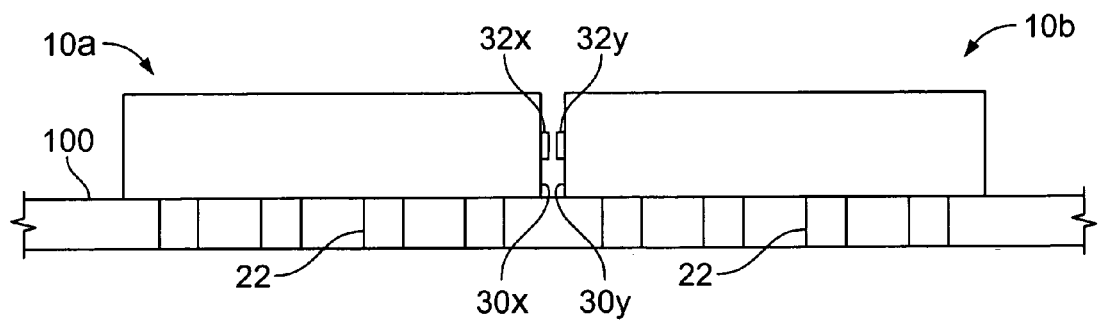
FIG. 3 is a simplified elevational view like FIG. 2 showing two components like the one shown in FIG. 1 mounted on the substrate surface in accordance with the invention.

Unlike contacts 22, contacts 32 are not conventionally located. Rather, contacts 32 are non-conventionally located (in accordance with the present invention) on one or more sides 30 of the component package that will be substantially perpendicular to the surface of the substrate (e.g., PCB 100 in FIG. 2) on which component 10 is or will be mounted. FIG. 3 shows an example of how these side contacts 32 can be used in accordance with the invention.

In FIG. 3 two components 10a and 10b (each of which can generally be like component 10 in earlier FIGS.) are mounted in close, side-by-side proximity to one another on the upper surface of PCB 100. In particular, each of components 10a and 10b has a side surface (30x and 30y, respectively) that is close to and faces toward the similar side surface of the other component. Thus, surfaces 30x and 30y are (1) both substantially perpendicular to the upper surface of PCB 100, (2) parallel to one another, (3) facing toward one another, and (4) separated from one another by a relatively small distance. In addition, each of surfaces 30x and 30y has on it or in it at least one exposed electrical contact 32x or 32y like any of the contacts 32 described above in connection with the earlier FIGS. Contacts 32x and 32y are preferably aligned with one another along an axis that is perpendicular to surfaces 30x and 30y. Contacts 32x and 32y may be spaced from one another by a small space as shown in FIG. 3 (although such spacing can be eliminated if desired). Any spacing between contacts 32x and 32y is preferably no more than 1.0 mm, more preferably no more than 0.5 mm, most preferably no more than 0.25 mm.

Figure 4:
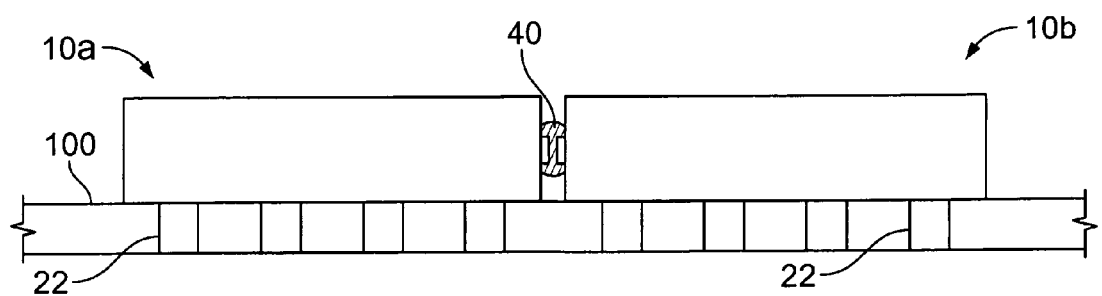
FIG. 4 is similar to FIG. 3, but shows the FIG. 3 structure after further processing in accordance with the invention.

As shown in FIG. 4, after components 10a, 10b, and 100 have been assembled as shown in FIG. 3, electrical connection between contacts 32x and 32y is made (or at least reinforced) by adding an electrically conductive substance between and/or around those contacts, e.g., as shown at 40 in FIG. 4. Examples of materials that are suitable for making connection 40 are solder, an electrically conductive epoxy material (e.g., an epoxy resin that is loaded with conductive metal particles that can contact on another and form a good electrical conductor over at least a short distance through the cured epoxy resin), or the like.

Figure 5:
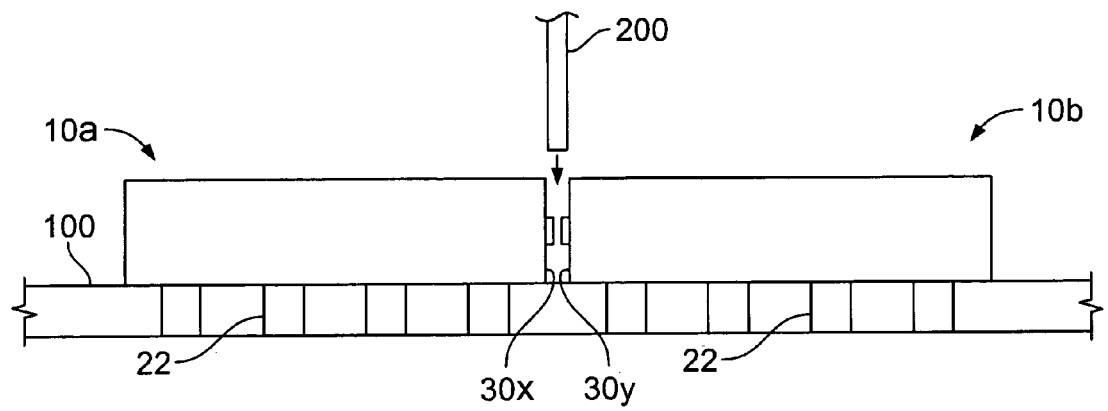
FIG. 5 is again similar to FIG. 3, but shows how the FIG. 4 condition may be achieved in accordance with the invention.

FIG. 5 shows an illustrative embodiment of how conductive connection material 40 may be introduced between components 10a and 10b to form or perfect the electrical connection between contacts 32x and 32y as shown in FIG. 4. As shown in FIG. 5, a syringe or syringe-like instrument 200 is positioned vertically above the gap between surfaces 30x and 30y, and also vertically above contacts 32x and 32y. Conductive connection material 40 in a fluid state is then forced out of the lower end of the hollow tube of instrument 200 and flows down between surfaces 30x and 30y and into contact with contacts 32x and 32y. For example, during such flow, conductive connection material 40 may be molten solder or uncured resin so that it can flow. Upon reaching contacts 32x and 32y, the fluid material 40 hardens (e.g., the molten solder cools or the uncured resin cures) to a solid so that it remains in place as shown in FIG. 4.

Figure 6:
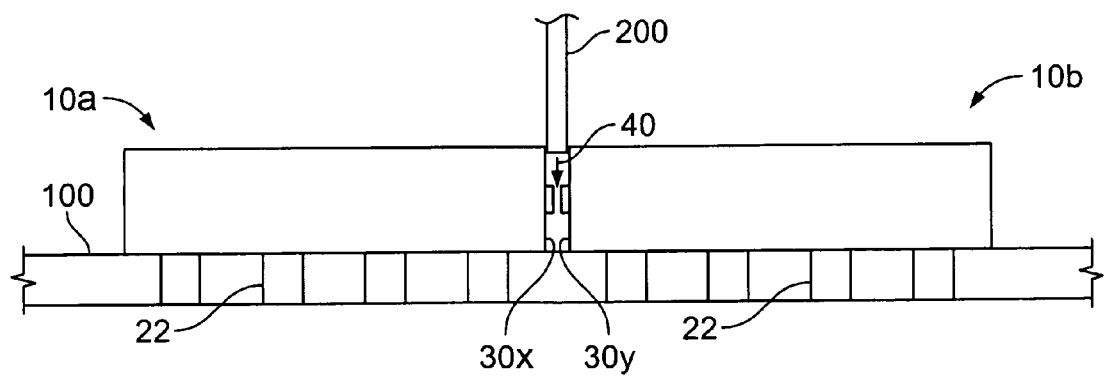
FIG. 6 is similar to FIG. 5, but shows a possible modification of what

FIG. 6 shows an alternative in which the lower end of instrument 200 is able to enter the space between surfaces 30x and 30y and thereby get even closer to contacts 32x and 32y as it ejects conductive connection material 40 onto the contacts.

Use of syringe-like instrument 200 to get conductive connection material 40 into contact with contacts like 32x and 32y is only an example of how this can be done, and any other suitable means may be used instead if desired.

Figure 7:
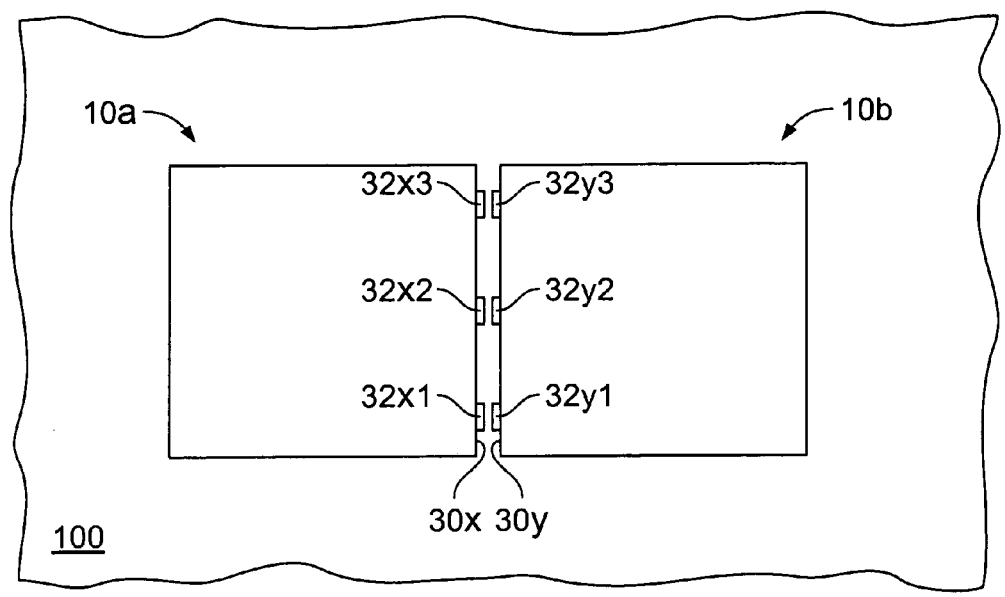
FIG. 7 is a simplified plan view of a structure like that shown in FIG. 3 in accordance with the invention.
Figure 8:
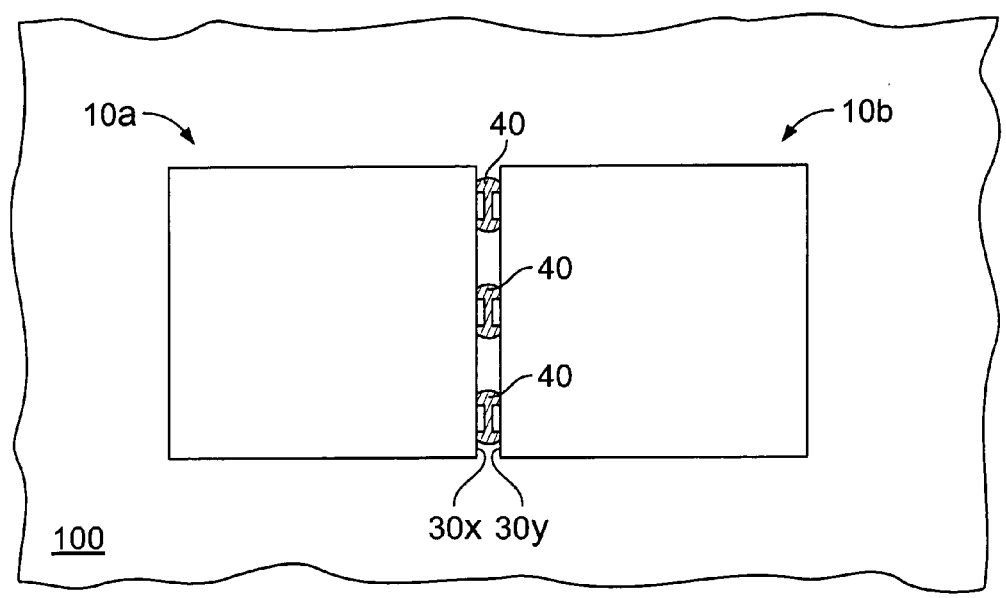
FIG. 8 is similar to FIG. 7, but shows the FIG. 7 structure after further processing in accordance with the invention.

FIG. 7 is a top view of structures that can be like what is shown in any of the earlier FIGS. FIG. 7 shows how multiple contacts 32 on the adjacent sides 30x and 30y of components 10a and 10b can line up with one another and be used (with the addition of conductive connection material 40 as shown in FIG. 8) to provide electrical connections between components 10a and 10b. For example, exposed electrical contact 32x1 on the side surface 30x of component 10a mounted on PCB 100 lines up with exposed electrical contact 32y1 on the side surface 30y of component 10b also mounted on PCB 100. Contacts 32x2 and 32y2 similarly line up with one another between surfaces 30x and 30y, as do contacts 32x3 and 32y3. To make or perfect the electrical connection between each of these aligned pairs of contacts, conductive connection material 40 is applied to each such pair as shown in FIG. 8 (e.g., in any of the ways shown and described above). The number of pairs of contacts 32x and 32y between components 10a and 10b that is shown in FIGS. 7 and 8 (i.e., three pairs of contacts) is only an example, and it will be understood more such pairs or less such pairs can be provided if desired.

Figure 9:
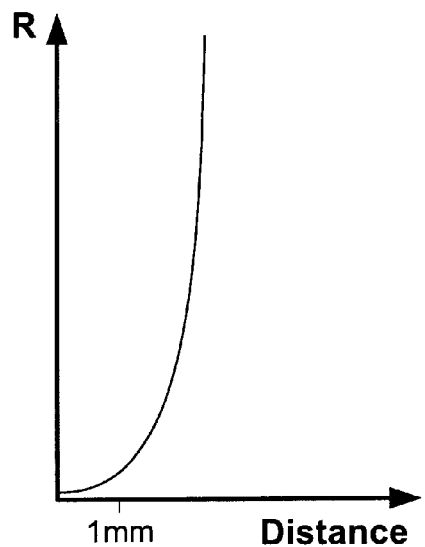
FIG. 9 is a simplified diagram of a material characteristic that may be provided and utilized in accordance with the invention.

If desired, conductive connection material 40 can have an electrical resistance characteristic like that shown in FIG. 9. This is a characteristic in which resistance of the material is very low across short distances through the material, but very high for significantly longer distances through the material. For example, FIG. 9 shows that the resistance through material 40 is very low for distances through that material of about 1 mm or less, but that resistance through the material increases greatly for distances greater than about 1 mm. Epoxy resin conductive connection material can be formulated to have this kind of a characteristic, e.g., by appropriately selecting such parameters as the size of the conductive particles in the resin matrix, the proportion of conductive particles to resin matrix, etc.

Figure 10:
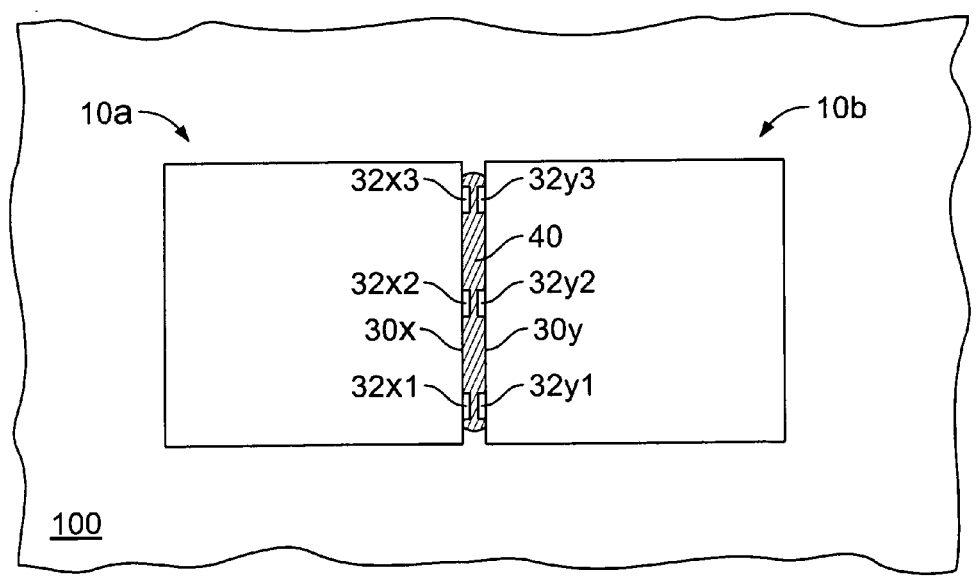
FIG. 10 is similar to FIG. 8, but illustrates a possible alternative in accordance with the invention.

A conductive connection material 40 having a resistance characteristic like that shown in FIG. 9 can be used on multiple contact pairs as shown, for example, in FIG. 10. As FIG. 10 shows, with this type of material 40 it is not necessary to physically separate the material 40 that connects each pair of contacts (e.g., 32x1 and 32y1) from the material 40 that connects other pairs of contacts (e.g., 32x2 and 32y2). The distance between the contacts in each pair is less than the distance at which resistance through material 40 becomes very large. Material 40 is therefore a good conductor of electricity between the contacts in each aligned pair of contacts (e.g., like 32x1 and 32y1). On the other hand, the distance between contacts 32 that are not aligned in a pair (e.g., the distance between contacts 32x1 and 32x2) is great enough that material 40 is not a good conductor of electricity between such not-aligned contacts. Accordingly, FIG. 10 shows that one continuous mass or body of material 40 can be applied to all of the contacts between surfaces 30x and 30y, and the result will be that effective electrical connections are only made between the contacts in each aligned pair of contacts (e.g., 32x1 and 32y1) and not between contacts that are in different ones of such pairs (e.g., material 40 does not produce a short-circuit connection between contacts 32x1 and 32x2 because those contacts are too far apart).

Components like 10a and 10b may be given surface features in the vicinity of contacts 32 to facilitate the introduction of material 40 into proximity to those contacts and/or to help keep material 40 confined to particular areas and away from other structures. An example of this principle is shown in FIG. 11, which is otherwise a view generally like FIG. 10.

Figure 11:
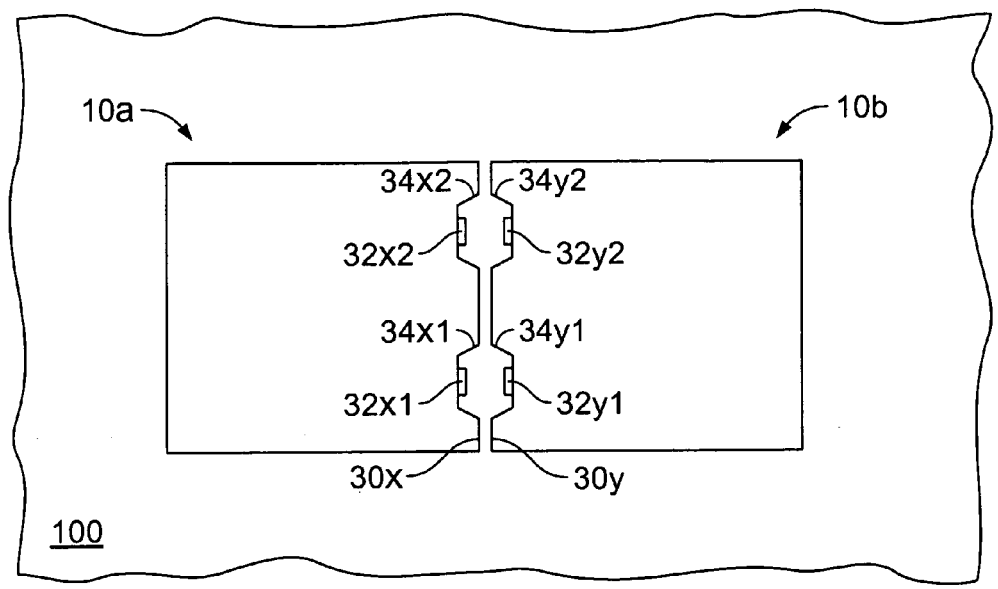
FIG. 11 is again similar to FIG. 7, but illustrates a possible alternative in accordance with the invention.

As shown in FIG. 11 (and also FIG. 12, which shows a representative portion of what is shown in FIG. 11 from another perspective), the side surface of each of components 10a and 10b having side contacts 32 is recessed (at 34) adjacent each of those contacts. When the sides 30x and 30y of components 10a and 10b are put together, these recesses 34 create separate or relatively separate openings between the two components. Each of these openings can be filled (or more or less filled) with conductive connection material 40 without that material being able to extend from one opening to other openings (see FIG. 13). Between the pairs of facing recesses (e.g., between recess pair 34xy1 and recess pair 34xy2) component package surfaces 30x and 30y can be sufficiently close to one another (or even in contact with one another) to prevent material 40 in the fluid state (i.e., during deposit into each recess pair 34xy) from flowing significantly beyond that recess pair (e.g., to reach contacts 32 in the next adjacent recess pair(s)). This helps ensure physical separation and therefore electrical isolation (insulation) of each connected pair of contacts 32 from all of the other contacts 32.

Figure 12:
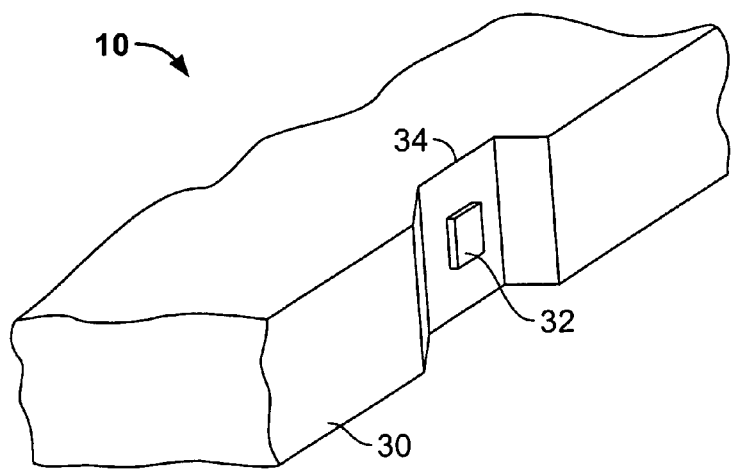
FIG. 12 is a simplified perspective or isometric view of a representative portion of one component in FIG. 11 in accordance with the invention.
Figure 13:
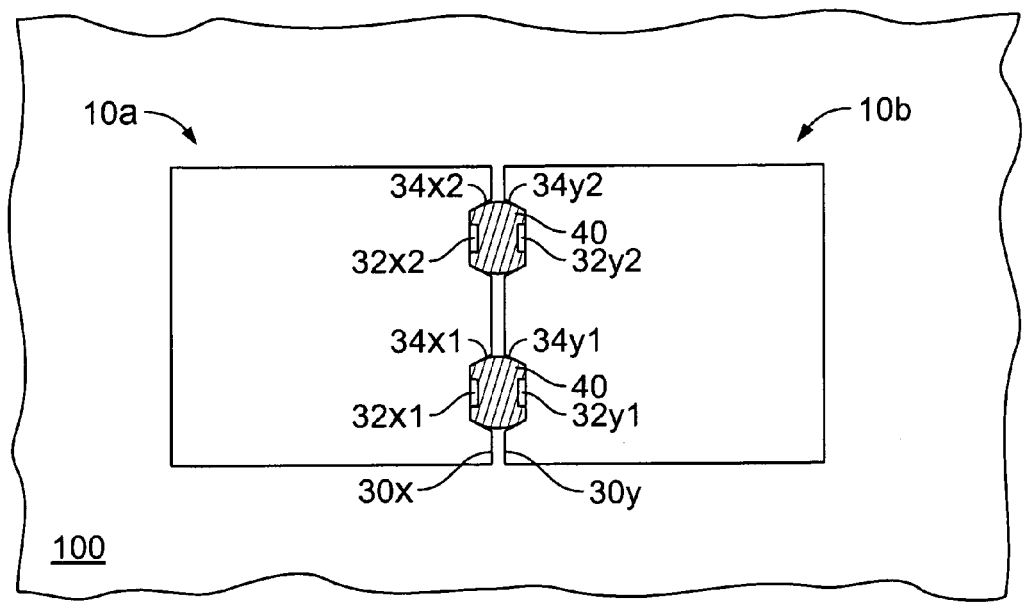
FIG. 13 is similar to FIG. 11, but shows the FIG. 11 structure after further processing in accordance with the invention.
Figure 14:
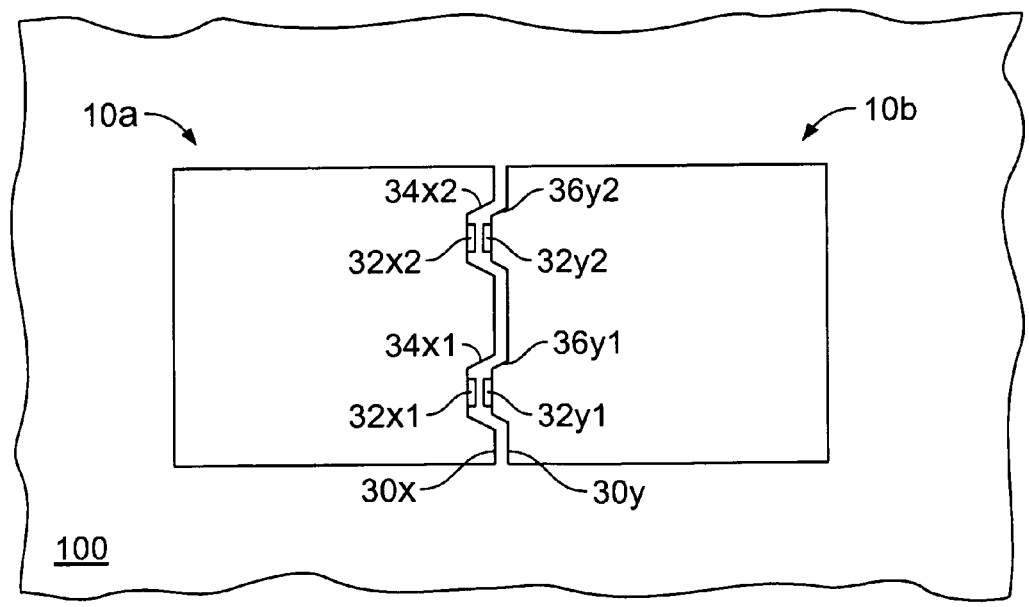
FIG. 14 is again similar to FIG. 11, but shows a possible alternative in accordance with the invention.
Figure 15:
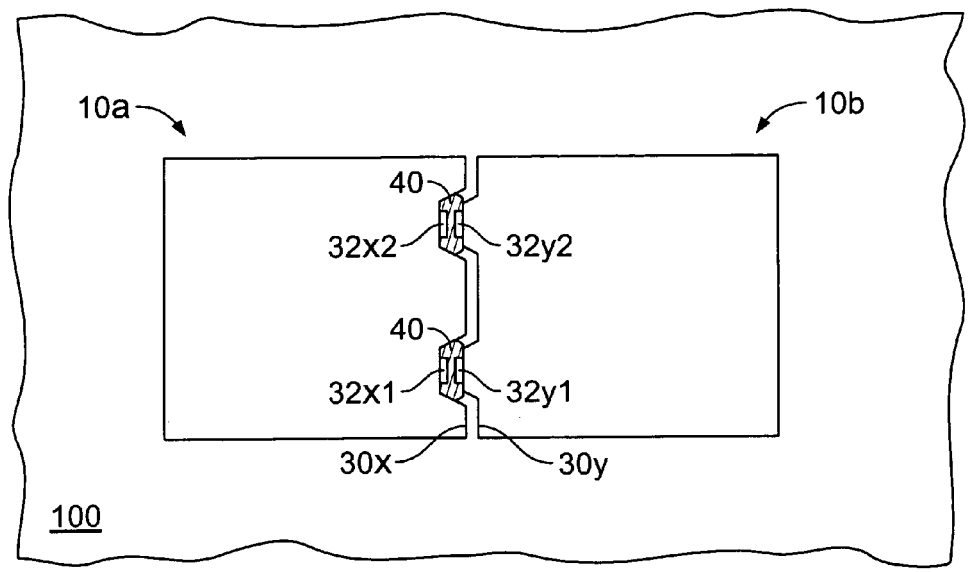
FIG. 15 is similar to FIG. 14, but shows the FIG. 14 structure after further processing in accordance with the invention.

FIG. 14 shows another example of modification of component package surface shapes in accordance with this invention. In FIG. 14 side surface 30x of component 10a can be like what is shown in FIGS. 11-13 for that component. It therefore includes a recess 34 in its side surface 30x for each of its contacts 32x (i.e., each of contacts 32x is located in a respective one of recesses 34x). Component 10b, on the other hand, has a raised protuberance 36 on its side surface 30y at each of its contacts 32y. Each of protuberances 36y can fit at least part way into a respective one of apertures 34x. The closeness and/or tightness of this fit can be designed as desired. This type of mating structure can again help to confine subsequently deposited conductive connecting material 40 to separate regions that are respectively adjacent each pair of facing contacts (e.g., 32x2 and 32y2) (see FIG. 15).

Figure 16:
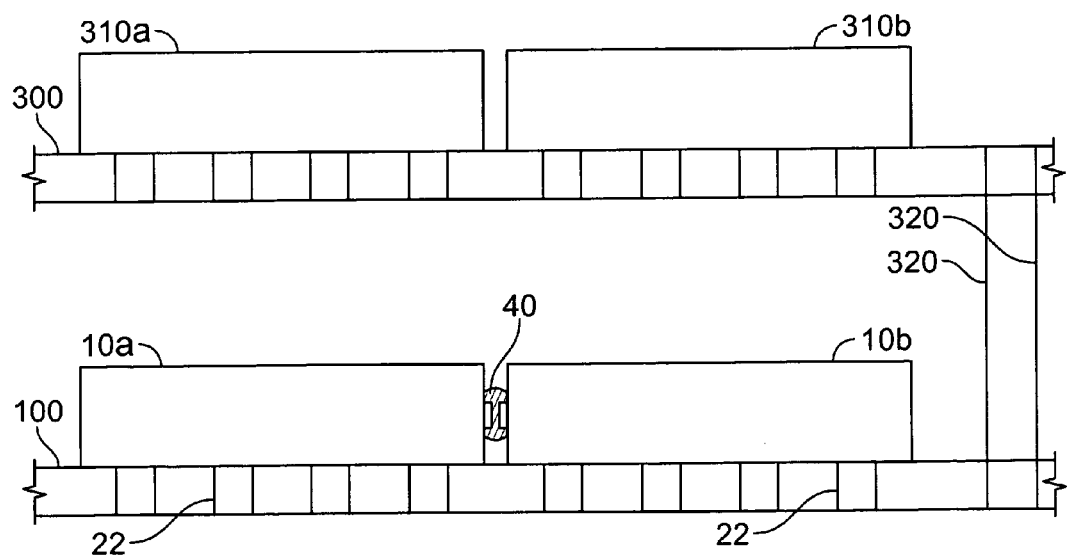
FIG. 16 is a simplified elevational view showing another possible context in which the invention may be employed.

FIG. 16 illustrates how the invention may be used in the context of a stack of PCBs. The lower part of FIG. 16 can be like what is shown in any of many of the earlier FIGS. (e.g., like FIG. 4). PCB 100 is connected to another PCB 300 above it by a plurality of vias 320. Other components (e.g., other packaged integrated circuit devices) 310a and 310b can be mounted on PCB 300.

Figure 17:
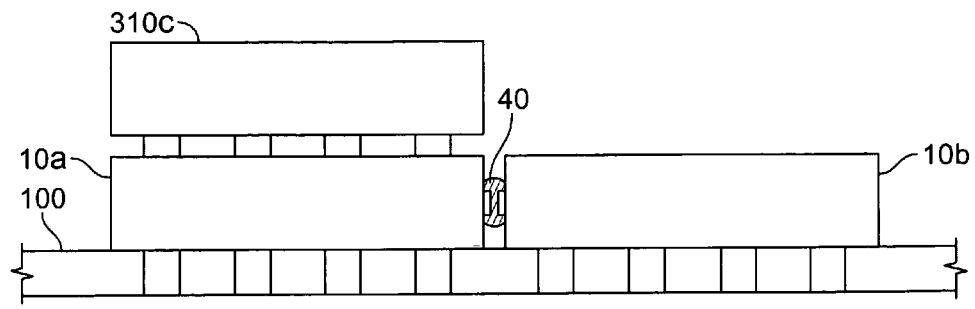
FIG. 17 is a simplified elevational showing another illustrative embodiment of employment of the invention.

FIG. 17 illustrates how the invention may be used in the context of POP assembly of some components. Again, the lower part of FIG. 17 can be like what is shown in any of several of the earlier FIGS. (e.g., like FIG. 4). FIG. 17 then shows the addition of another component 310c (e.g., another packaged integrated circuit device) on top of component 10a using POP techniques.

Figure 18:
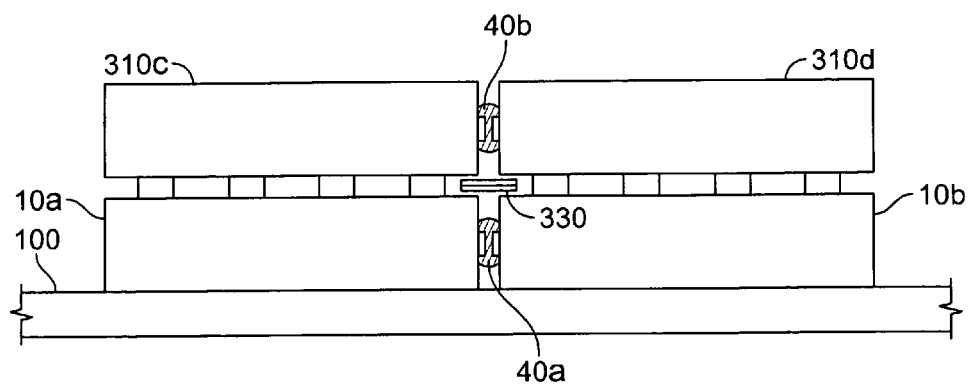
FIG. 18 is a simplified elevational view showing another illustrative embodiment of the invention.

FIG. 18 shows extension of what is shown in FIG. 17 to include two layers of application of the present invention. Once again, the lower portion of FIG. 18 may be as described earlier. After those components (100, 10a, 10b, and 40a) have been assembled, a separator 330 (typically of an insulating material) may be placed above the facing side surfaces of components 10a and 10b. POP is then used to assemble components 310c and 310d on top of components 10a and 10b, respectively. In this case, components 310c and 310d are like components 10a and 10b, in that they have exposed electrical contacts on their side surfaces that face one another. Conductive connecting material 40b is then deposited in contact with each adjacent pair of such side contacts on components 310c and 310d to electrically connect the contacts in each such pair. Separator 330 keeps material 40b from flowing down to structures below the level of POP components 310c and 310d.

Figure 19:
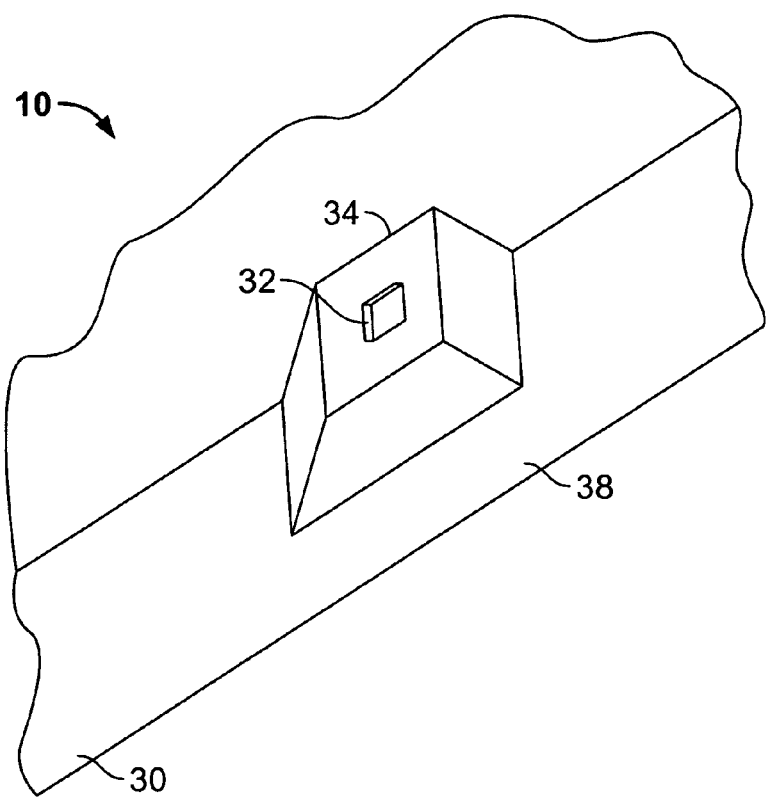
FIG. 19 is a simplified perspective or isometric view of another illustrative structure in accordance with the invention.
Figure 20:
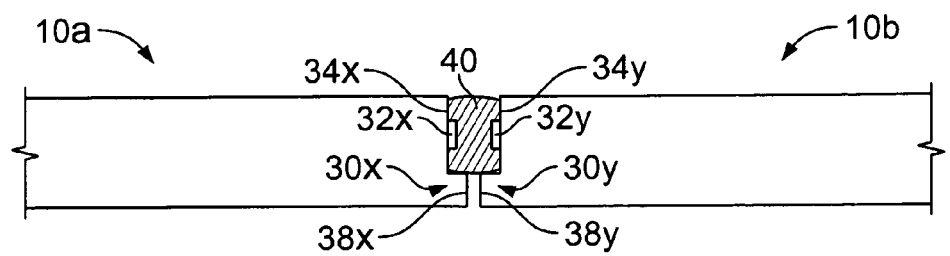
FIG. 20 is a simplified cross-sectional view showing use of structures like what is shown in FIG. 19 in accordance with the invention.

FIG. 19 shows another example of a geometry that may be used to help control the deposit of conductive connection material 40 in proximity to pairs of side contacts that need to be connected in accordance with the invention. As shown in FIG. 19, representative exposed contact 32 is disposed in a recess 34 in the side surface 30 of component package 10. In this case, however, recess 34 does not extend all the way to the bottom surface of component 10. Instead, the portion 38 of side surface 30 below recess 34 is not recessed. Accordingly, when side 30 of component 10 is placed close to the side of another component, a well with a bottom is formed. An example of this is shown in FIG. 20 in which two component 10a and 10b (each as shown in FIG. 19) are placed side by side. Recesses 34x and 34y then collectively form a well, but unrecessed surface portions 38x and 38y come closer together so that the well effectively has a bottom that is above the bottom-most surfaces of components 10a and 10b. (FIG. 20 is a cross-sectional view through components 10a and 10b at the location of the contacts 32x and 32y that are in the above-mentioned well.) Then when conductive connection material 40 is deposited in contact with contacts 32x and 32y, that material is confined to the above-mentioned well. It is prevented from flowing down from the well by the bottom of the well (38xy), and it is prevented from flowing sideways (e.g., into other wells) by the sides of the well. A feature like this can be used immediately above PCB 100 in any of the earlier FIGS. (to keep material 40 off the PCB), and/or it can be used in POP layers (to keep material 40 from flowing down to structures below). In the latter case, for example, it may render the provision of a separate separator like 330 in FIG. 18 unnecessary.

Figure 21:
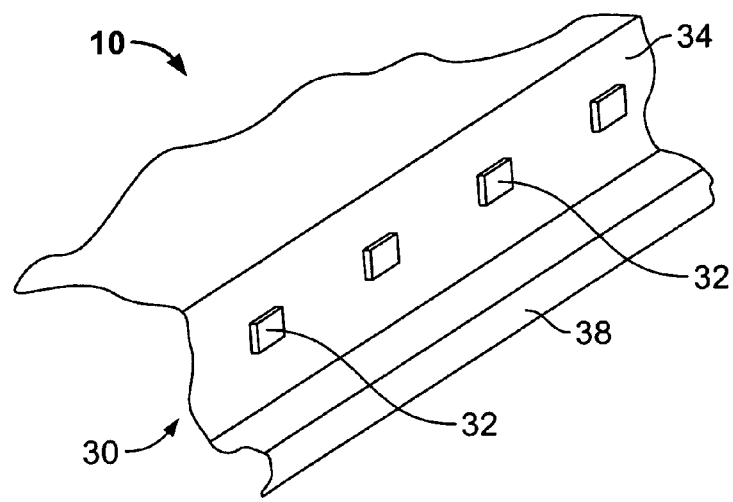
FIG. 21 is a view similar to FIG. 19 for another illustrative structure in accordance with the invention.
Figure 22:
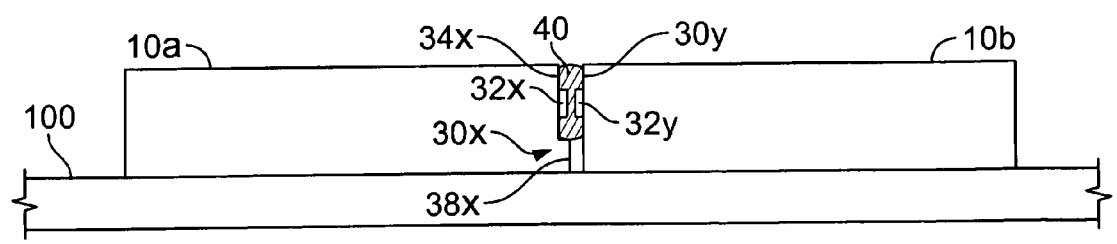
FIG. 22 is a simplified elevational view showing use of a structure like what is shown in FIG. 21 in accordance with the invention.

FIG. 21 illustrates the point that the principle shown in FIGS. 19 and 20 is not limited to providing separate wells for each contact pair. Thus FIG. 21 shows the upper portion 34 of side surface 30 recessed, and several contacts 32 in that recess. Below this recess, side surface 30 is not recessed (as shown at 38). When two such components 10 are put together, unrecessed portion 38 of side surface 30 will be close enough to the other component to prevent material 40 from flowing down to any structure below. FIG. 22 further illustrates this point, and further shows that only one of the components (i.e., 10a in this example) needs to have such a partially recessed side surface 30x. The facing side surface 30y of the other component 10b can have another shape (e.g., unrecessed or flat) to cooperate with unrecessed surface 38x and thereby form a channel with a bottom that retains material 40 and keeps it from flowing to any structure below.

Figure 23:
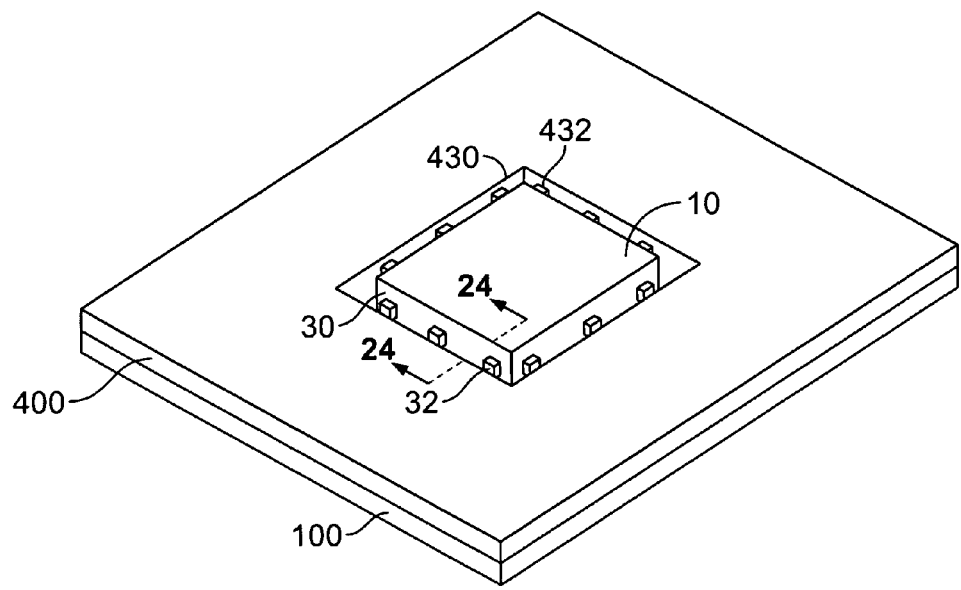
FIG. 23 is a simplified perspective or isometric view showing another illustrative embodiment of the invention.
Figure 24:
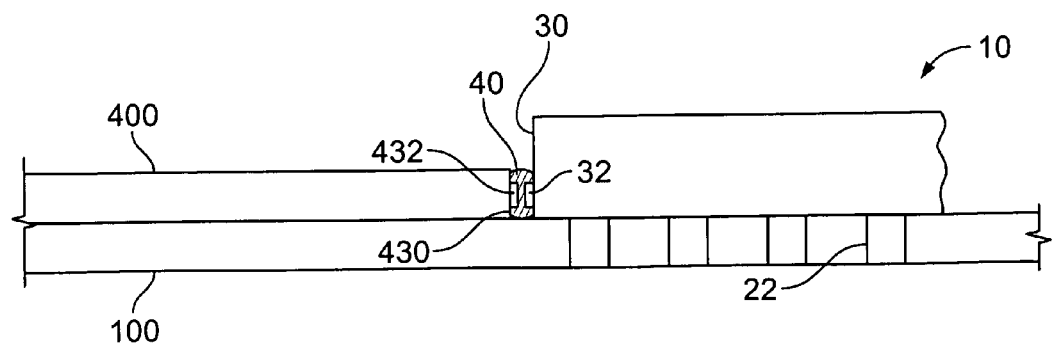
FIG. 24 is a simplified sectional view showing a representative portion of structure like that shown in FIG. 23 in accordance with the invention.

FIGS. 23 and 24 illustrate application of the invention to a so-called embedded device structure. This structure includes substrate 100 (e.g., a PCB), at least one other generally similar structure 400 (e.g., one or more other layers of PCB structure) on top of substrate 100 but having an aperture with sides 430 that are substantially perpendicular to the upper surface of substrate 100, and component 10 (e.g., a packaged integrated circuit device) disposed on substrate 100 in the aperture in structure 400. Component 10 has at least one exposed electrical contact 32 on at least one of its sides 30 that is substantially perpendicular to the upper surface of substrate 100. Structure 400 also has at least one exposed electrical contact 432 on at least one of the sides 430 of the aperture through that structure. When component 10 is mounted in the aperture in structure 400, above-mentioned contacts 32 and 432 form an adjacent, facing, and generally aligned pair of contacts that can be electrically connected to one another by depositing conductive connection material 40 in contact with them as shown in FIG. 24. This can be done for any number of layers of circuitry in structure 400. Any of the principles illustrated in earlier FIGS. can be applied again to applications like those illustrated by FIGS. 23 and 24.

As was mentioned above, it is generally preferred that the distance between the contacts in a pair of contacts that are to be connected in accordance with this invention (e.g., two contacts 32, or a contact 32 and a contact 432) be relatively small (i.e., no more than 1.0 mm, more preferably no more than 0.5 mm, most preferably no more than 0.25 mm).

It will be understood that the foregoing is only illustrative of the principles of the invention, and that various modifications can be made by those skilled in the art without departing from the scope and spirit of the invention. For example, the numbers of contact pairs that are provided and connected in accordance with the invention can be different from the numbers shown in the various FIGS. herein. Also, although the FIGS. herein frequently show only two components 10 connected to one another by the invention in any given plane, it will be understood that more than two components in a plane can be connected to one another by the invention. For example, three components can be connected to one another in a straight line or an L on substrate 100; four components can be connected to one another in a square, a line, an L, or a T on substrate 100; etc.

What is claimed is:

1. An electrical circuit assembly comprising:
   a substrate surface;
   a first packaged integrated circuit component mounted on the substrate surface and having a first side surface that is substantially perpendicular to the substrate surface, the first component further having a first exposed electrical contact on the first side surface;
   a second packaged integrated circuit component mounted on the substrate surface and having a second side surface that is substantially perpendicular to the substrate surface, the second component further having a second exposed electrical contact on the second side surface, the first and second components being positioned on the substrate surface so that the first and second surfaces face toward one another, and so that the first and second contacts are within 1.0 mm of one another between the first and second surfaces; and
   an electrically conductive connector material that has been deposited in contact with the first and second contacts between the first and second surfaces, wherein the first side surface is recessed from another portion of that surface at the location of the first contact.

2. The assembly defined in claim 1 wherein the substrate surface comprises a surface of a printed circuit board.

3. The assembly defined in claim 1 wherein the connector material comprises:
   solder.

4. The assembly defined in claim 1 wherein the connector material comprises:
   epoxy resin.

5. The assembly defined in claim 1 wherein the first and second contacts are within 0.5 mm of one another.

6. The assembly defined in claim 1 wherein the first and second contacts are within 0.25 mm of one another.

7. An electrical circuit assembly comprising:
   a substrate surface;
   a first packaged integrated circuit component mounted on the substrate surface and having a first side surface that is substantially perpendicular to the substrate surface, the first component further having a first exposed electrical contact on the first side surface;
   a second packaged integrated circuit component mounted on the substrate surface and having a second side surface that is substantially perpendicular to the substrate surface, the second component further having a second exposed electrical contact on the second side surface, the first and second components being positioned on the substrate surface so that the first and second surfaces face toward one another, and so that the first and second contacts are within 1.0 mm of one another between the first and second surfaces; and
   an electrically conductive connector material that has been deposited in contact with the first and second contacts between the first and second surfaces, wherein the first side surface is raised from another portion of that surface at the location of the first contact.

8. An electrical circuit assembly comprising:
   a substrate surface;
   a first packaged integrated circuit component mounted on the substrate surface and having a first side surface that is substantially perpendicular to the substrate surface, the first component further having a first exposed electrical contact on the first side surface;
   a second packaged integrated circuit component mounted on the substrate surface and having a second side surface that is substantially perpendicular to the substrate surface, the second component further having a second exposed electrical contact on the second side surface, the first and second components being positioned on the substrate surface so that the first and second surfaces face toward one another, and so that the first and second contacts are within 1.0 mm of one another between the first and second surfaces;
   an electrically conductive connector material that has been deposited in contact with the first and second contacts between the first and second surfaces;
   a third packaged integrated circuit component mounted on the first component and having a third side surface that is substantially perpendicular to the substrate surface, the third component further having a third exposed electrical contact on the third side surface;
   a fourth packaged integrated circuit component mounted on the second component and having a fourth side surface that is substantially perpendicular to the substrate surface, the fourth component further having a fourth exposed electrical contact on the fourth side surface, the third and fourth components being positioned on the first and second components so that the third and fourth surfaces face toward one another, and so that the third and fourth contacts are within 1.0 mm of one another between the third and fourth surfaces; and
   an electrically conductive connector material that has been deposited in contact with the third and fourth contacts between the third and fourth surfaces.

9. The assembly defined in claim 8 further comprising:
a separator below the third and fourth surfaces.

10. A method of making an electrical circuit assembly comprising:
providing a substrate surface;
providing first and second packaged integrated circuit components having respective first and second side surfaces and respective first and second exposed electrical contacts on the first and second surfaces;
mounting the first and second components on the substrate surface so that the first and second surfaces are substantially perpendicular to the substrate surface and so that the first and second surfaces face toward one another with the first and second contacts no more than 1.0 mm from one another between the first and second surfaces; and
depositing electrically conductive connector material in contact with the first and second contacts between the first and second surfaces, wherein the first surface is recessed to provide a recess at the location of the first contact, and wherein the depositing comprises:
introducing the electrically conductive connector material into the recess.

11. The method defined in claim 10 wherein the depositing comprises:
introducing the electrically conductive connector material into contact with the first and second contacts while the material is in a flowable fluid form.

12. The method defined in claim 10 wherein the recess is open to a top surface of the first component, and wherein the introducing comprises:
flowing the electrically conductive connector material downwardly into the recess past the top surface.

13. The method defined in claim 11 further comprising:
allowing the electrically conductive connector material to solidify from the flowable fluid form after the electrically conductive connector material is in contact with the first and second contacts.

14. A method of making an electrical circuit assembly comprising:
providing a substrate surface;
providing first and second packaged integrated circuit components having respective first and second side surfaces and respective first and second exposed electrical contacts on the first and second surfaces;
mounting the first and second components on the substrate surface so that the first and second surfaces are substantially perpendicular to the substrate surface and so that the first and second surfaces face toward one another with the first and second contacts no more than 1.0 mm from one another between the first and second surfaces;
depositing electrically conductive connector material in contact with the first and second contacts between the first and second surfaces;
mounting third and fourth packaged integrated circuit components on top of the third and fourth components, respectively; the third and fourth components having respective third and fourth side surfaces and respective third and fourth exposed electrical contacts on the third and fourth surfaces; the third and fourth side surfaces being substantially perpendicular to the substrate surface and facing toward one another with the third and fourth contacts no more than 1.0 mm from one another between the first and second surfaces; and
depositing electrically conductive connector material in contact with the third and fourth contacts between the third and fourth surfaces.

15. The method defined in claim 14 further comprising:
introducing a separator below the third and fourth surfaces prior to depositing the material in contact with the third and fourth contacts.

16. An electrical circuit assembly comprising:
a substrate surface;
a first packaged integrated circuit component mounted on the substrate surface and having a first side surface that is substantially perpendicular to the substrate surface, the first component further having a first exposed electrical contact on the first side surface;
a second circuit component mounted on the substrate surface and having an aperture through the second component in which the first component is disposed so that the second component surrounds the first component, the aperture having a second side surface that is substantially perpendicular to the substrate surface, the second component further having a second exposed electrical contact on the second surface within 1.0 mm of the first contact; and
an electrically conductive connector material that has been deposited in contact with the first and second contacts between the first and second surface.

17. The assembly defined in claim 16 wherein substrate surface comprises a surface of a printed circuit board.

18. The assembly defined in claim 16 wherein the second component comprises a printed circuit board.

19. The assembly defined in claim 16 wherein the first and second contacts are within 0.5 mm of one another.

20. The assembly defined in claim 16 wherein the first and second contacts are within 0.25 mm of one another.

21. A method of making an electrical circuit assembly comprising:
providing a substrate surface;
mounting a first packaged integrated circuit component on the substrate surface, the first component having a first side surface that is substantially perpendicular to the substrate surface and that has on the first side surface a first exposed electrical contact;
mounting a second circuit component on the substrate surface, the second component having an aperture through the second component in which the first component is disposed so that the second component surrounds the first component, the aperture having a second side surface that is substantially perpendicular to the substrate surface and that has on the second side surface a second exposed electrical contact within 1.0 mm of the first contact; and
depositing electrically conductive connector material in contact with the first and second contacts between the first and second surfaces.

22. The method defined in claim 21 wherein the depositing comprises:
introducing the electrically conductive connector material into contact with the first and second contacts while the material is in a flowable fluid form.

23. The method defined in claim 22 further comprising:
allowing the electrically conductive connector material to solidify from the flowable fluid form after the electrically conductive connector material is in contact with the first and second contacts.

* * * * *

UNITED STATES PATENT AND TRADEMARK OFFICE
CERTIFICATE OF CORRECTION

| | | |
|---|---|---|
| PATENT NO. | : 7,957,153 B2 | Page 1 of 1 |
| APPLICATION NO. | : 12/006618 | |
| DATED | : June 7, 2011 | |
| INVENTOR(S) | : Michael Rosenblatt et al. | |

It is certified that error appears in the above-identified patent and that said Letters Patent is hereby corrected as shown below:

In column 10, line 26, in Claim 16, delete "surface." and insert -- surfaces. --, therefor.

Signed and Sealed this
Twenty-ninth Day of November, 2011

David J. Kappos
*Director of the United States Patent and Trademark Office*